(12) United States Patent
Miner et al.

(10) Patent No.: US 8,232,611 B2
(45) Date of Patent: Jul. 31, 2012

(54) HIGH QUALITY GATE DIELECTRIC FOR SEMICONDUCTOR DEVICES AND METHOD OF FORMATION THEREOF

(75) Inventors: Carla Miner, Carp (CA); Thomas MacElwee, Nepean (CA); Marwan Albarghouti, Stittsville (CA)

(73) Assignee: Group IV Semiconductor, Inc., Ottawa (CA)

( * ) Notice: Subject to any disclaimer, the term of this patent is extended or adjusted under 35 U.S.C. 154(b) by 201 days.

(21) Appl. No.: 12/814,712

(22) Filed: Jun. 14, 2010

(65) Prior Publication Data

US 2011/0024819 A1 Feb. 3, 2011

Related U.S. Application Data

(60) Provisional application No. 61/187,424, filed on Jun. 16, 2009.

(51) Int. Cl.
*H01L 29/78* (2006.01)
*H01L 29/788* (2006.01)

(52) U.S. Cl. ..... 257/410; 257/288; 257/411; 257/E29.3; 257/E29.255; 257/315

(58) Field of Classification Search ............... 257/288, 257/410, 411, E29.3, E29.255, 315
See application file for complete search history.

(56) References Cited

U.S. PATENT DOCUMENTS

| 6,093,944 A * | 7/2000 | VanDover ............ 257/310 |
| 2002/0050608 A1 * | 5/2002 | Landheer et al. ........ 257/310 |

* cited by examiner

*Primary Examiner* — Victor A Mandala
(74) *Attorney, Agent, or Firm* — Teitelbaum & MacLean; Neil Teitelbaum; Doug MacLean

(57) ABSTRACT

Improved high quality gate dielectrics and methods of preparing such dielectrics are provided. Preferred dielectrics comprise a rare earth doped dielectric such as silicon dioxide or silicon oxynitride. In particular, cerium doped silicon dioxide shows an unexpectedly high charge-to-breakdown $Q_{BD}$, believed to be due to conversion of excess hot electron energy as photons, which reduces deleterious hot electron effects such as creation of traps or other damage. Rare earth doped dielectrics therefore have particular application as gate dielectrics or gate insulators for semiconductor devices such as floating gate MOSFETs, as used in as flash memories, which rely on electron injection and charge transfer and storage.

28 Claims, 6 Drawing Sheets

HIGH QUALITY GATE DIELECTRIC FOR SEMICONDUCTOR DEVICES AND METHOD OF FORMATION THEREOF

CROSS-REFERENCE TO RELATED APPLICATIONS

The present invention claims priority from U.S. Provisional Patent Application No. 61/187,424 filed Jun. 16, 2009, which is incorporated herein by reference.

TECHNICAL FIELD

This invention relates to high quality dielectric materials for semiconductor devices, and in particular to gate dielectrics for semiconductor devices using hot electron injection, e.g. flash memory (EEPROM) and other non-volatile memory devices.

BACKGROUND OF THE INVENTION

There are a number of types of semiconductor devices which depend on high quality oxides or dielectrics for reliable operation.

For example, the gate oxide in a conventional MOSFET device or gate dielectric (gate insulator) in an IGFET device or other gate controlled semiconductor device plays a critical role in device performance, reliability and scaling. In such a device, normally no current flows through the gate dielectric, and high quality oxides or dielectrics, with low trap density and high breakdown field, are required to minimize gate leakage.

However in another class of device (non-volatile memory devices, such as flash memory, a form of EEPROM), the gate dielectric is expected to transport charge when a high electric field is applied. The charge is transferred to a floating gate or to a charge storage layer, where it is stored to provide non-volatile memory capability. Charge is typically injected by applying a high voltage pulse of one polarity and discharged with a high voltage pulse of the opposite polarity. In this case an important parameter is charge-to-breakdown (i.e. the total quantity of charge that can be transported before dielectric breakdown occurs or before the leakage current at low field becomes unacceptably high under such operating conditions). Breakdown may be caused by an accumulation of charge in the gate oxide, which alters the internal electric field, or through the creation of defects, which may themselves be charged and which thus affect subsequent electron transfer. Once electron transport becomes too easy, either runaway occurs and the device breaks down, or the leakage current becomes unacceptably high.

Flash memories are usually made from one of two basic structures, depending upon the nature of the means by which electric charge is stored within the gale structure. In the floating gate structure, charge is stored in (typically) a polysilicon layer that is located between two layers of gate dielectric and is electrically isolated from the rest of the transistor (the "floating" gate). When a high electric field is applied to the gate, some charge is transported to the floating gate ("write" cycle). The presence of the excess charge is detected because it changes the threshold voltage of the MOSFET (the "read" cycle). In the charge storage structure the middle layer of the gate dielectric stack is a material with a smaller bandgap than the surrounding dielectric (e.g. silicon nitride and/or silicon nanocrystals within silicon dioxide). Then a lower field (than for the floating gate structure) is required to deposit charge in the storage layer, where it remains while the MOSFET is held near flat band.

In any of these devices, appropriate selection of gate oxide or other gate dielectric materials with appropriate properties is required for optimum performance.

There are a number of approaches conventionally used to manage device performance and reliability:

Improve oxide quality—i.e. reduce intrinsic impurities, defects and traps that may result in excessive leakage current.

Limit electron energy—electrons pick up energy linearly with distance (ballistic regime) until at a certain point they collide with atoms of the material in which they are travelling, either speed up or slow down, and create defects. Therefore limit the electron energy by using dielectrics with reduced thickness so as to remain in the ballistic regime.

Use another charge storage structure in preference to the floating gate structure, (e.g. SST SuperFlash EEPROM Technology, Technical Paper, Revised March 1999) since a lower electric field ~4 MV/cm may be used in that case.

In flash memories that use high voltages, the time of oxide exposure to high electric fields can influence device reliability. Floating gate memory devices may use high electric fields ~10 MV/cm during erasing. Consequently a great deal of research has gone into alternative materials and structures to improve reliability and lifetime, to enable more read/write cycles. A split gate structure may allow for operation at lower electric fields ~4 MV/cm (SST SuperFlash EEPROM Technology, Technical Paper, Revised March 1999). Other types of non-volatile memory cells, based on charge trapping, using a charge trapping layer and charge blocking layer, are disclosed, for example, in U.S. Pat. No. 7,525,149 and US patent publication 2008/0217681 which describe particular dielectric materials and structures that may improve device performance and reliability.

Even after applying these strategies most non-volatile memory devices are still sufficiently limited in lifetime that they can only be used in storage applications where a modest number of read/write cycles is expected over the life of the product in which they are used.

Thus, improved or alternative solutions are desirable to overcome the limitations of current gate oxide materials, particularly with respect to charge-to-breakdown and to mitigate hot electron effects for floating gate devices and other semiconductor devices which rely on electron injection and charge transfer and storage.

The present invention seeks to overcome, or ameliorate, one or more of the abovementioned disadvantages, or at least provide an alternative.

SUMMARY OF THE INVENTION

One aspect of the present invention provides a gate dielectric for a semiconductor device comprising a rare earth doped dielectric.

Another aspect of the invention provides a gate controlled semiconductor device comprising a gate dielectric wherein the dielectric comprises rare earth doped silicon dioxide.

Rare earth doped dielectrics are particularly beneficial as gate dielectrics in floating gate devices and other semiconductor devices that rely on electron injection and charge transfer and storage.

Another aspect of the invention provides a charge trapping device, such as a floating gate MOSFET, for a memory device wherein the gate dielectric/insulator comprises a rare earth doped dielectric. The memory device may be an EEPROM or a flash memory device.

Advantageously, the rare earth doped dielectric comprises rare earth doped silicon dioxide. Other alternatives are rare earth doped silicon oxynitride, aluminum oxide, or other materials under consideration as gate dielectrics.

Cerium doped silicon dioxide has particular advantages as will be described below Desirable ranges of cerium concentrations ($\rho$) for doping are determined by the thickness of the dielectric (d), the accepted value for the electron capture cross-section of cerium ($\alpha$), and the desired fraction of the hot electrons that are slowed (f); the relation is:

$$\rho = -\ln(1-f)/\alpha d.$$

For example, if d=10 nm, $\alpha=10^{-13}$ cm$^2$, and f=90%, then $\rho=2.3\times10^{19}$ cm$^{-3}$, or 0.035 at % in silicon dioxide. Therefore the range of cerium concentration is typically 0.01-0.1 at %, but its value will be properly determined by the relationship given above. This calculation assumes a uniform distribution as a function of depth. If the distribution is non-uniform, then a more general relationship for the area density of rare earths (N) is used:

$$N = -\ln(1-f)/\alpha.$$

Possible other preferred rare earth species for doping are gadolinium, or terbium or other rare earth species with a large electron capture cross section. Thus cerium, gadolinium and terbium and mixtures thereof are preferred. Other rare earths such as europium may not be as suitable.

Another aspect of the invention provides a gate controlled electronic device comprising a gate electrode and a gate dielectric, wherein the gate dielectric comprises a conventional dielectric with a concentration of rare earths distributed within it.

In these structures, the rare earth species absorb energy from hot electrons and convert energy to photons, i.e. light emission, i.e. thereby dissipating hot electron energy as light. Rare earth species have a high capture cross section and therefore effectively dissipate hot electron energy at low concentrations without otherwise interfering with device operation.

Since cerium has a particularly high capture cross-section for hot electrons, it is a preferred species for this application. Other rare earth species, such as gadolinium, europium and terbium may alternatively be used alone, or in combination, e.g. with cerium.

BRIEF DESCRIPTION OF THE DRAWINGS

The invention will be described in greater detail with reference to the accompanying drawings which represent preferred embodiments thereof, wherein.

DETAILED DESCRIPTION

Figure 1A:
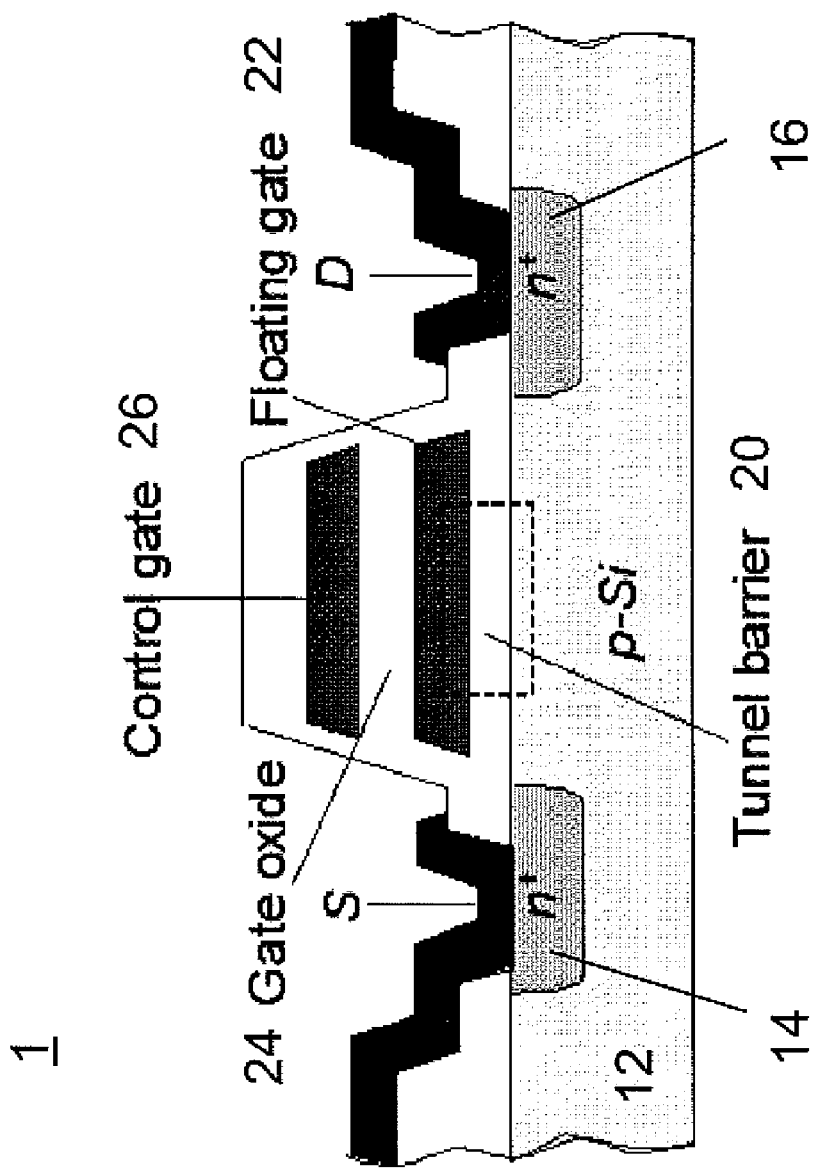
FIG. 1A, shows a simplified schematic of an example of conventional floating gate devices, such as a floating gate MOSFET as used in a Flash memory (a form of EEPROM)
Figure 1B:
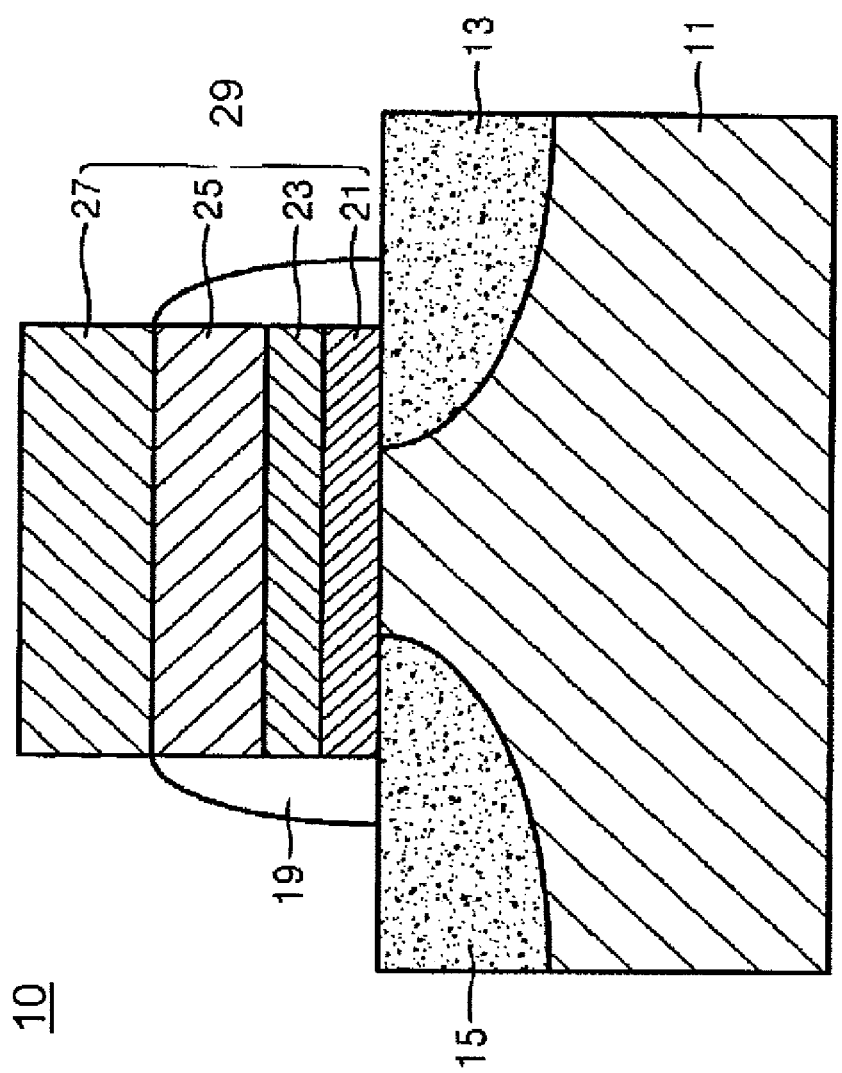
FIG. 1B shows a trap memory device having charge trap/charge block structure using nanocrystals or other charge trap layer.

FIG. 1A shows typical floating gate transistor structures, for example as used in flash memories and other semiconductor devices, showing the gate dielectric. In particular referring to the structure shown in FIG. 1A, the device structure 1 comprises a p type substrate 12, in which is defined source and drain regions 14, 16 and a channel region 18. A first gate oxide layer, i.e. a tunnel dielectric layer 20 is formed on the substrate over the channel region 18 under a floating gate 20, and a second gate oxide 22 or dielectric layer separates the floating gate 20 from a control gate 24. FIG. 1B shows a charge trap type device 10 for a memory cell comprising a substrate 11, source and drain regions 13 and 15, on which is formed a gate structure 29, comprising a tunnel oxide layer 21, a charge trapping layer 23 such as a silicon nitride or oxynitride layer, which may contain semiconductor nanocrystals or other charge trapping material, a charge blocking dielectric layer 25 and a gate electrode 27.

Figure 2:
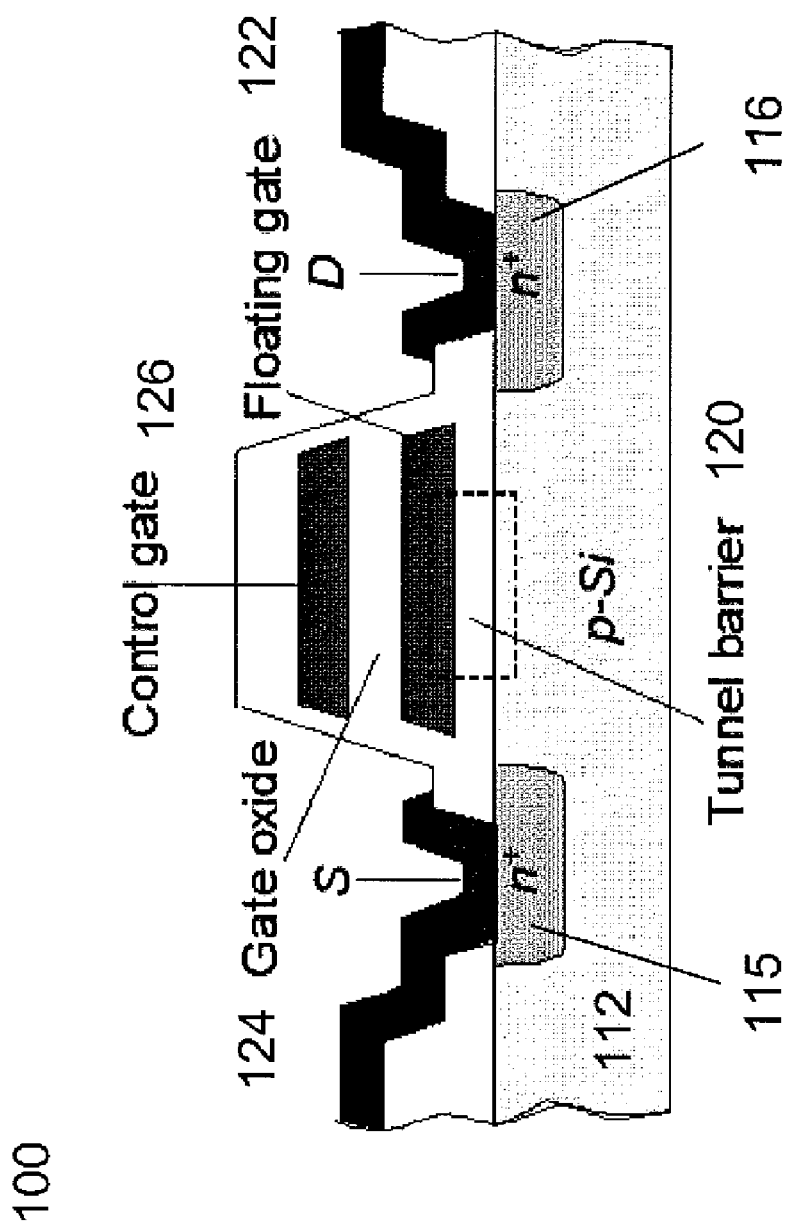
FIG. 2 shows a simplified device structure according to an embodiment of the present invention.

In a preferred embodiment of the present invention, as shown in FIG. 2, a non volatile memory device structure 100 is shown which comprises a substrate 112, typically a p type substrate, in which is defined a source 114 and drain 116 with a channel region 118 therebetween, with a gate structure formed thereon in which a first gate oxide, or more particularly the tunnelling dielectric 120, in such a device comprises cerium doped silicon dioxide, as will be described below. A floating gate 122, a second gate oxide layer 124, and a control gate 126 are formed thereon.

In alternative embodiments, the gate/tunnel dielectric 120 comprises rare earth doped silicon dioxide, silicon oxynitride or aluminum oxide, or other gate dielectric containing a concentration of rare earth ions.

Other types of device in which charge transfer is desirable include light emitting devices, such as electroluminescent devices (for example as described in copending U.S. patent application Ser. No. 11/642,788) in which current is passed through an active layer which may comprise a dielectric layer containing luminescent centres. Since light emission from impact ionisation or impact excitation is required, higher energy electrons are needed to excite luminescent centres, and a thicker oxide and more current is desirable. Consequently limiting current or reducing oxide thickness are not options to improving reliability and charge-to-breakdown in these types devices. Consequently improving quality of the oxide or dielectric is required to reduce trap density for superior operation. Nevertheless, it is also desirable to limit damage caused by hot electrons, i.e. electrons with excess energy over that desirable for the effective operation of the device, which may cause damage or defects or other deleterious effects.

In the course of studies to look at improving efficiency of such electroluminescent devices, the properties of dielectric layers comprising silicon dioxide doped with rare earth species were studied as active layers, i.e. light emitting layers, and as intervening dielectric layers which function as buffer layers or drift layers. Desirably, in the latter dielectric layers, under an applied electric field, electrons gain sufficient energy in passing through the buffer/drift layer, to excite luminescent species in an adjacent active layer. However very hot electrons with excess energy may cause deleterious effects such as accumulation of charge and creation of traps of defects in the active regions, or contribute to other breakdown effects or damage elsewhere in the device.

Figure 3:
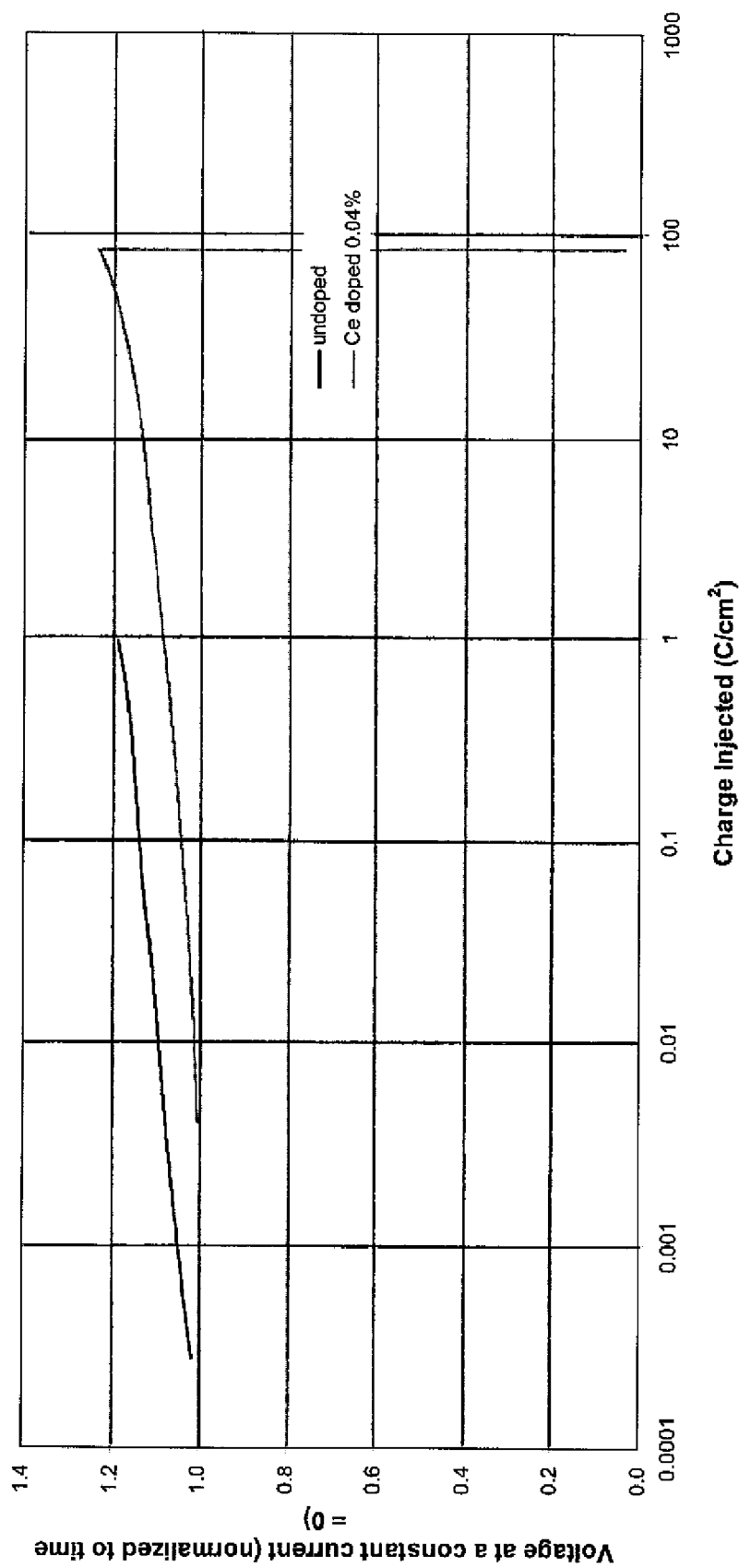
FIG. 3 illustrates typical graphs for accumulated charge-to-breakdown $Q_{BD}$ for silicon dioxide gate oxide and gate dielectrics prepared according embodiments of the present invention.
Figure 4:
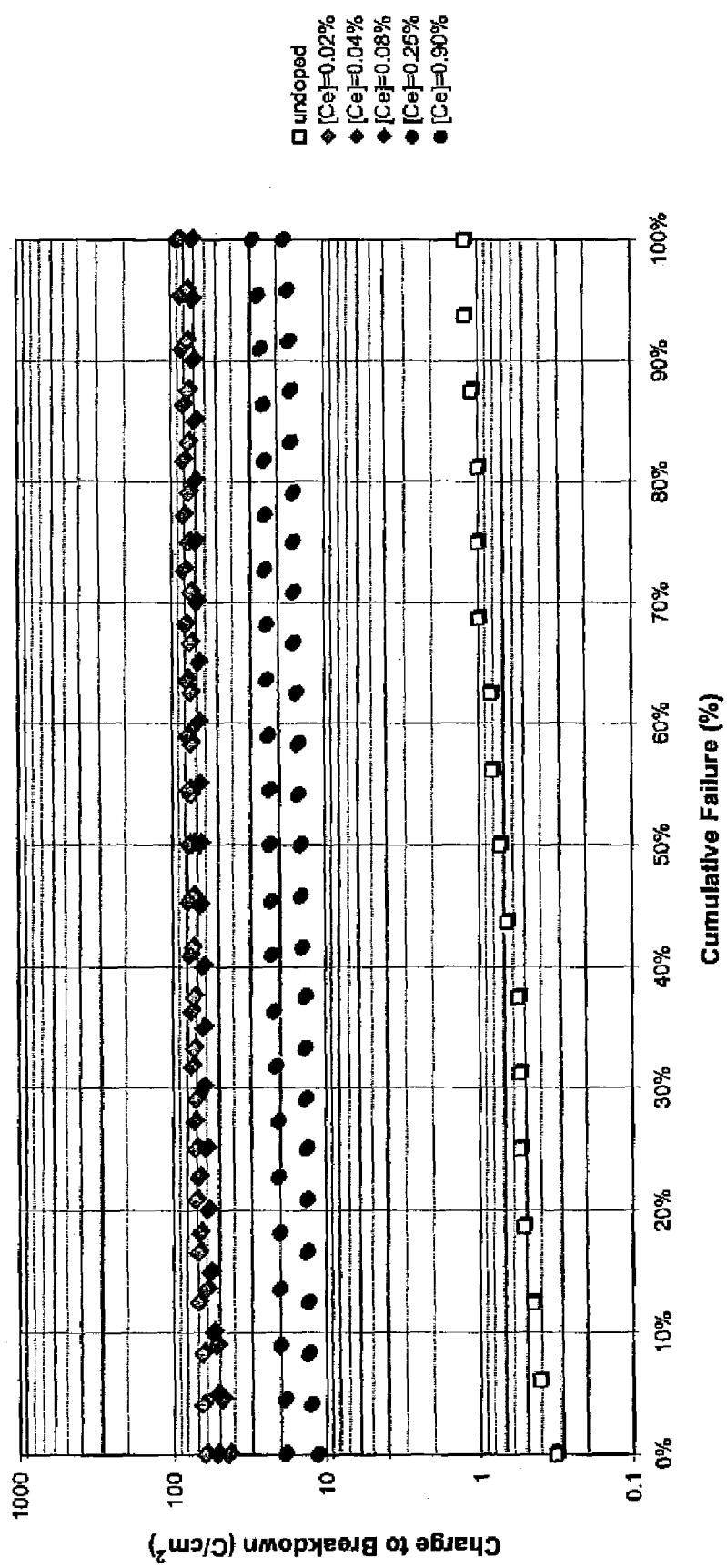
FIG. 4 illustrates typical graphs showing dependence of log QBD vs. accumulative failure rate for silicon dioxide and for dielectric samples prepared according to embodiments of the present invention.
Figure 5:
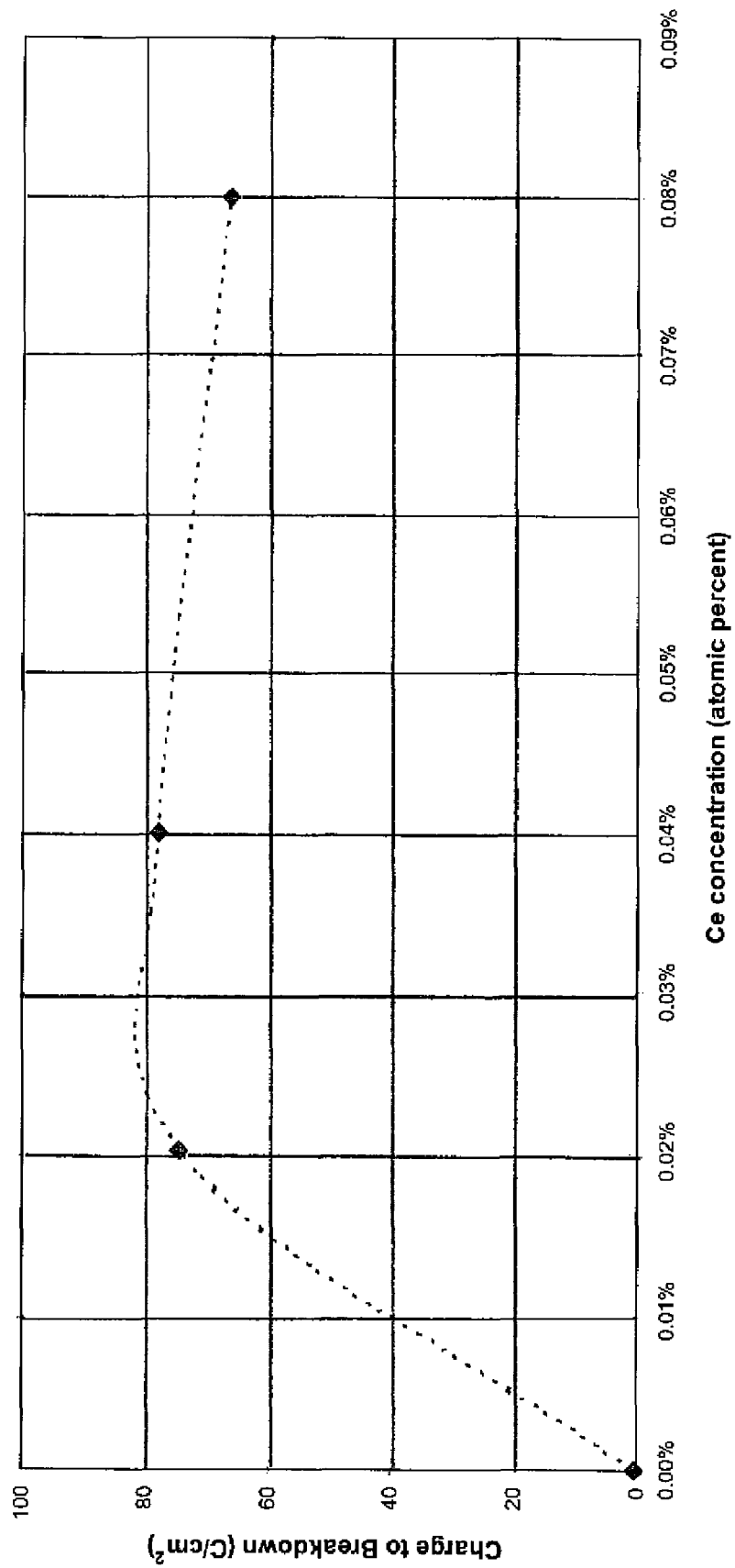
FIG. 5 illustrates the dependence of $Q_{BD}$ on cerium concentration in cerium doped silicon dioxide.

Some typical results are shown schematically in FIGS. 3 to 5 which compare cerium doped silicon dioxide with undoped silicon dioxide.

As shown schematically in FIG. 3, during testing, the charge-to-breakdown $Q_{BD}$ of cerium doped silicon dioxide (~100 C/cm$^2$) was observed to be significantly higher than that of pure silicon dioxide (0.02 C/cm$^2$). That is, there was a dramatic and unexpected increase in lifetime of devices before breakdown. Further studies of samples with different cerium concentrations showed a dependence of $Q_{BD}$ cerium concentration as shown in FIGS. 4 and 5. These results suggested that the presence of cerium reduced charging and increased lifetime. These effects were observed at cerium concentrations of 0.01% to 0.1%, which are below values of interest for generation of light from active layers in luminescent devices.

In silicon dioxide and silicon oxynitride dielectric layers, it is believed that hot electrons lose energy non-adiabatically, i.e. energy is converted to heat, and energy is dissipated as phonon energy; or through the creation of defects.

On the other hand, since cerium has a high capture cross section in dielectrics, i.e. $10^{-13}$ cm$^2$ vs. $4 \times 10^{-14}$ cm$^2$ for terbium, another rare earth, cerium is particularly effective in capturing very hot electrons and dissipating energy by conversion to light energy, i.e. emission of photons. Other rare earth elements are expected to do the same, but with lesser efficiency.

Without wishing to be limited to any particular theory, it is believed that this effect is related to the electron energies of rare earths elements, and in particular the orbital structure of 5s, 4d and 4f orbitals, of rare earth ions and cerium in particular, for which the d and f orbitals have a smaller radius than the s orbital.

These unexpected results therefore indicate that doping silicon dioxide or other dielectric material such as silicon nitride or silicon oxynitride with a low concentration of a suitable rare earth element may significantly improve oxide properties including charge-to-breakdown. Results with cerium doped silicon dioxide are particularly promising for reasons suggested above.

It is therefore proposed that rare earth doped dielectrics such as silicon dioxide, silicon oxynitride, and in particular cerium doped silicon dioxide have particular application as gate dielectrics in gate controlled semiconductor devices such as floating gate MOSFETs or flash memories, which use hot electron injection and in which it is required to transfer charge through a dielectric in a controlled fashion.

The device structure shown in FIG. 2 is a simple representative example of a floating gate cell comprising cerium doped silicon dioxide as the tunnel dielectric under the floating gate. Preferably the dielectric comprises a concentration of about 0.01-0.1 at % of cerium. Cerium doped silicon dioxide may be used for both the tunnel dielectric or charge transfer dielectric and the control gate dielectric, or another conventional or known dielectric may be used as the control gate dielectric.

More generally, the tunnel dielectric or charge transfer dielectric may comprise silicon dioxide, silicon oxynitride or other conventional gate dielectric with a rare earth dopant, such as cerium, gadolinium, and europium having a high electron capture cross section, of a suitable concentration as described below.

Such novel rare earth doped gate dielectrics may be applicable to various devices structures for memory cells, for example, as shown in FIG. 1A which comprise a tunnel oxide, charge transfer oxide, or gate oxide and a floating gate for storing charge, or trap memory structures such as shown in FIG. 1B, using a charge trapping/charge blocking layer under the control gate. The novel gate dielectric may also be applicable for other charge transfer and storage device structures in which two "conductive" layers are separated by a "gate" dielectric or gate insulator, e.g. a MIM or MOS type device.

As will be appreciated generation of photons to dissipate hot electron energy may contribute to photoelectric/photoconductivity induced effects and although these effects are expected to be small, may for example contribute to a shift in threshold voltage or other properties of the device.

Cerium or other rare earth doped silicon dioxide dielectrics may be prepared with low thermal budget by known CVD processes such as PECVD, LPCVD, or ALD which are compatible with typical processing conditions for fabrication of floating gate MOSFETs and flash memory devices Suitable rare earth precursors may be added during oxide deposition using liquid or vapour injection. Sputter deposition may also be possible.

For rare earth doped, e.g. cerium doped, silicon dioxide, low energy ion implantation into thermal oxide is also a preferred method.

Desirable ranges of cerium concentrations (ρ) for doping are determined by the thickness of the dielectric (d), the accepted value for the electron capture cross-section of cerium (α), and the desired fraction of the hot electrons that are slowed (f); the relation is:

$$\rho = -\ln(1-f)/\alpha d.$$

For example, if d=10 nm, δ=$10^{-13}$ cm$^2$, and f=90%, then ρ=2.3×$10^{19}$ cm$^{-3}$, or 0.035 at % in silicon dioxide. Therefore the range of cerium concentration is typically 0.01-0.1 at %, but its value will be properly determined by the relationship given above. This calculation assumes a uniform distribution as a function of depth. If the distribution is non-uniform, then a more general relationship for the area density of rare earths (N) is used:

$$N = -\ln(1-f)/\alpha.$$

Possible other preferred rare earth species for doping are gadolinium, or europium, i.e. rare earth species with a large capture cross section.

Desirable ranges of cerium concentrations (ρ) for doping is likely to be a sufficiently low concentration to avoid unwanted effects and yet effectively manage hot electron effects. For terbium, for example, because the capture cross section is believed to be approximately an order of magnitude smaller, the concentration would need to be ~1 to 5% which may be in a range leading to other effects (clustering). Nevertheless, it is envisaged that co-doping with two or more species may allow for capture of hot electrons with a range of different energies. Alternatively a cerium doped layer may be combined with a terbium doped layer or other rare earth doped layer to capture electrons of different energies. Typically, gate dielectric layers of thickness ~5 nm to 10 nm are contemplated.

Rare earth doped silicon dioxide is preferably provided by formation of a thermal oxide and ion implantation. Deposition processes as mentioned above may be used to provide a wider range of materials.

INDUSTRIAL APPLICABILITY

High quality gate dielectrics as described above, and in particular, cerium doped silicon dioxide, shows an unexpectedly high charge-to-breakdown $Q_{BD}$, believed to be due to conversion of excess hot electron energy as photons, which reduces deleterious hot electron effects such as creation of traps or other damage. Rare earth doped gate dielectrics therefore have particular application as gate dielectrics or gate insulators for semiconductor devices such as floating gate MOSFETs, as used in as flash memories or other memory cells which rely on electron injection and charge transfer and storage. Benefits may include improved device lifetime and reliability, and an increased number of read/write cycles.

Although embodiments of the invention have been described in detail, variations and modifications to the embodiments may be made without departing from the scope of the invention which is defined by the following claims.

We claim:

1. A charge transfer (or tunnel) dielectric for a memory cell comprising a cerium doped silicon dioxide;
wherein the cerium doped silicon dioxide comprises about 0.01-0.1 at % cerium.

2. A gate controlled semiconductor device comprising a gate dielectric wherein the gate dielectric comprises cerium doped silicon dioxide;
wherein the cerium doped silicon dioxide comprises about 0.01-0.1 at % cerium.

3. A semiconductor device structure comprising a floating gate transistor for a memory device wherein a tunnel dielectric of the floating gate transistor comprises a rare earth doped dielectric.

4. A device according to claim 3, wherein the rare earth doped dielectric comprises rare earth doped silicon dioxide.

5. A device according to claim 3, wherein the rare earth doped dielectric comprises cerium doped silicon dioxide.

6. A device according to claim 5, wherein the cerium doped silicon dioxide comprises about 0.01-0.1 at % cerium.

7. A device according to claim 3, wherein the rare earth comprises one of cerium, gadolinium, terbium and mixtures thereof.

8. A semiconductor device structure for a memory cell comprising:
a substrate having a plurality of doped regions, a first gate dielectric comprising a tunnel dielectric formed thereon, an overlying charge storage layer, a second gate dielectric and a control gate, and wherein the tunnel dielectric comprises a rare earth doped dielectric.

9. A device according to claim 8, wherein the rare earth doped dielectric comprises rare earth doped silicon dioxide.

10. A device according to claim 8, wherein the rare earth doped dielectric comprises cerium doped silicon dioxide.

11. A device according to claim 10, wherein the cerium doped silicon dioxide comprises about 0.01-0.1 at % cerium.

12. A device according to claim 8, wherein the rare earth comprises one of cerium, gadolinium, terbium and mixtures thereof.

13. A flash memory device comprising a floating gate MOSFET having a gate dielectric comprising a rare earth doped dielectric.

14. A device according to claim 13, wherein the rare earth doped dielectric comprises rare earth doped silicon dioxide.

15. A device according to claim 13, wherein the rare earth doped dielectric comprises cerium doped silicon dioxide.

16. A device according to claim 15, wherein the cerium doped silicon dioxide comprises about 0.01-0.1 at % cerium.

17. A device according to claim 13, wherein the rare earth comprises one of cerium, gadolinium, terbium and mixtures thereof.

18. An EEPROM device having a gate dielectric comprising a rare earth doped dielectric.

19. A device according to claim 18, wherein the rare earth doped dielectric-comprises rare earth doped silicon dioxide.

20. A device according to claim 18, wherein the rare earth doped dielectric comprises cerium doped silicon dioxide.

21. A device according to claim 20 wherein the cerium doped silicon dioxide comprises about 0.01-0.1 at % cerium.

22. A device according to claim 18, wherein the rare earth comprises one of cerium, gadolinium, terbium and mixtures thereof.

23. A device comprising one of a MIM device and a MOS device wherein first and second conductive layers are separated by a dielectric comprising a rare earth doped dielectric.

24. A device according to claim 23 wherein the rare earth doped dielectric comprises one of rare earth doped silicon dioxide, rare earth doped aluminum oxide, and rare earth doped silicon oxynitride.

25. A device according to claim 23, wherein the rare earth doped dielectric comprises rare earth doped silicon dioxide.

26. A device according to claim 23, wherein the rare earth doped dielectric comprises cerium doped silicon dioxide.

27. A device according to claim 26, wherein the cerium doped silicon dioxide comprises about 0.01-0.1 at % cerium.

28. A device according to claim 23, wherein the rare earth comprises one of cerium, gadolinium, terbium and mixtures thereof.

* * * * *